United States Patent [19]
Fujihara

[11] Patent Number: 6,060,707
[45] Date of Patent: *May 9, 2000

[54] APPARATUS AND METHOD FOR ANALYZING MICROSCOPIC AREA

[75] Inventor: Norito Fujihara, Nara, Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/964,854

[22] Filed: Nov. 5, 1997

[30] Foreign Application Priority Data

Nov. 26, 1996 [JP] Japan .................................. 8-314067

[51] Int. Cl.[7] .................................................. H01J 37/295
[52] U.S. Cl. .......................... 250/311; 250/307; 250/305
[58] Field of Search ..................................... 250/310, 305, 250/311, 397, 307

[56] References Cited

U.S. PATENT DOCUMENTS

| | | | |
|---|---|---|---|
| 4,117,323 | 9/1978 | Greer et al. | 250/311 |
| 4,438,332 | 3/1984 | Lichtenegger | 250/310 |
| 5,502,306 | 3/1996 | Meisburger et al. | 250/397 |
| 5,656,811 | 8/1997 | Itoh et al. | 250/310 |

FOREIGN PATENT DOCUMENTS

| | | |
|---|---|---|
| 51-7993 | 1/1976 | Japan . |
| 51-45585 | 4/1976 | Japan . |
| 6-273297 | 7/1994 | Japan . |

*Primary Examiner*—Bruce C. Anderson
*Attorney, Agent, or Firm*—Nixon & Vanderhye P.C.

[57] ABSTRACT

A primary electron beam applied to a thinned sample excites Auger electrons on a surface of the thinned sample, and most of the primary electron beam is transmitted by the thinned sample, scattering and reflection are restrained and an Auger electron generation area is micrified. A primary electron beam transmitted by the thinned sample passes through a hole and is directed to a Faraday cup disposed immediately below the sample. The primary electron beam entering the Faraday cup is scattered and reflected within the Faraday cup and effectively absorbed and captured by the Faraday cup. By maintaining the potential of the Faraday cup at a ground potential during the analysis, stable data are obtained.

6 Claims, 8 Drawing Sheets

APPARATUS AND METHOD FOR ANALYZING MICROSCOPIC AREA

BACKGROUND OF THE INVENTION

1. Field of the Invention

The present invention relates to a microscopic area analyzing apparatus and method for applying a primary electron beam to a surface of a solid sample to detect secondary electrons having a specific energy, released by the application of the primary electron beam, to perform an elemental analysis of a microscopic area of the surface of the solid sample.

2. Description of the Related Art

When a primary electron beam accelerated to several hundreds of electron volts to several tens of kiloelectron volts is applied to a surface of a solid sample, Auger electrons and characteristic X-rays, etc. are released which are associated with the element of the solid sample. Of these, the Auger electrons have an energy specific to the element. The AES (Auger electron spectroscopy) to measure the elemental composition of the surface of the solid sample by performing an energy analysis of the Auger electrons is an analyzing method providing high spatial resolution and surface sensitivity and finds applications in various fields. An apparatus where a function is added of scanning the sample surface with a micrified primary electron beam is the SAM (scanning Auger microscopy) apparatus. Prior arts concerning the AES and the SAM are disclosed, for example, in Japanese Unexamined Patent Publications JP-A 51-45585 (1976) and JP-A 51-7993 (1976).

FIG. 8 shows a basic structure of a conventional AES apparatus. An electron gun comprises a filament 15 for emitting a primary electron beam 8 and a lead wire 16. A focusing lens 17 is provided for focusing the primary electron beam 8. Deflecting electrodes 18 are provided for deflecting the primary electron beam 8. An objective lens 19 is provided for micrifying the primary electron beam 8. A detector 20 is provided for performing an energy analysis of the Auger electrons. A solid sample 21 to which the primary electron beam 8 is applied is fixed onto a sample support 22. A secondary electron detector 24 is provided for image observation.

As shown in FIG. 9, conventionally, the solid sample 21 is fixed onto a metal-made sample support 22 with sample fixing screws 5. In this case, as shown in FIG. 10, when the primary electron beam 8 accelerated to several hundreds of electron volts to several tens of kiloelectron volts is applied to the solid sample 21, the primary electrons are scattered and secondary electrons and characteristic X-rays are generated within the solid object based on the application of the electron beam, so that the Auger electrons are excited. In areas other than the area to which the thinned beam 8 is applied, the Auger electrons are also excited by the scattered electrons, the secondary electrons and the characteristic X-rays caused in the solid sample 21. By this process, of the Auger electrons excited in an Auger electron excitation area 23, only Auger electrons excited in an Auger electron generation area 9 which is smaller than the area where the Auger electrons are released (approximately several nanometers from the sample surface) are detected as signals.

Conventionally, the analysis of a microscopic area with the AES or the SAM apparatus is performed by micrifying the diameter of the primary electron beam 8. In recent years, an advance in the technology has enabled the diameter of the primary electron beam 8 to be micrified to approximately 100 angstroms so that an area 14 to which the primary electron beam 8 is applied is micrified. However, due to the influence of the scattering of the primary electron beam 8, etc. mentioned above, the Auger electron generation area 9 is several times greater than the actual diameter of the primary electron beam 8 as shown in FIG. 10.

FIG. 11 shows as an example of the solid sample 21 a sample of an LSI comprising a silicon oxide film 11, an aluminum film 12, a titanium-tungsten film 13 and another silicon oxide film 11. FIG. 12 shows results of an AES analysis of the aluminum film 12 of the solid sample shown in FIG. 11. As for the thicknesses of films of the solid sample 21, the aluminum film 12 is approximately 6000 angstroms thick and the titanium-tungsten film 13 is approximately 3000 angstroms thick. The AES measurement is performed by use of the primary electron beam 8 of 1 nanoampere. The acceleration at this time is made at 20 kiloelectron volts. The diameter of the primary electron beam 8 at this time is not more than 3000 angstroms.

As shown in FIG. 12, in addition to an Al-KLL Auger peak from the aluminum film 12 in the solid sample 21, a weak Si-KLL Auger peak is detected. Although the primary electron beam 8 is applied only to the aluminum film 12, a minute quantity of silicon is detected due to the expansion of the analysis area associated with the scattering of the primary electron beam 8 in the solid sample 21.

FIG. 13 shows a case where the analysis is performed with a thinned sample 1 fixed to the sample support 22. The thinned sample 1, which has a smaller thickness in its center, is fixed to the sample support 22 by use of the sample fixing screws 5 and a sample fixing plate 6. When the AES is performed, as shown in FIG. 14, the expansion of an Auger electron excitation area 23a in the thinned sample 1 can be restrained. However, a primary electron beam 10 transmitted by the thinned sample 1 excites the Auger electrons on the surface of the sample support 22 to form an Auger electron excitation area 23b. In addition, while in the analyzing method using the conventional thick solid sample 21, reflection of the primary electron beam 8 from the sample support 22 causes no problem because the scattering area of the primary electron beam 8 stays within the solid sample 21, in the analyzing method using the thinned sample 1, the primary electron beam 8 reflected by the surface of the sample 22 is again transmitted by the thinned sample 1.

Japanese Unexamined Patent Publication JP-A 51-45585 discloses a microscopic area analyzing apparatus using a thinned sample. In this prior art, in order to improve the focusing characteristic of the primary electron beam, a detector is disposed opposite to the side of the primary electron beam application to the thinned sample so as not to include the optical axis of the primary electron beam, and in the arrangement totally different from that of FIG. 8, the area to be analyzed is micrified. However, the primary electron beam transmitted by the sample is not removed. In addition, no consideration is given to the scattering and the reflection of the primary electron beam transmitted by the sample.

In Japanese Unexamined Patent Publication JP-A 51-7993 (1976), the sample support incorporates a Faraday cylinder and the sample current derived from the primary electron beam for scanning the sample surface is precisely measured. The Auger analysis is performed with the arrangement as shown in FIG. 8 similarly to the above-described prior art. Nothing is considered as to the micrifying of the analysis area for the Auger analysis.

In Japanese Unexamined Patent Publication JP-A 6-273297 (1994), a prior art is disclosed which uses a Faraday cup for detecting the endpoint in etching the sample with an ion beam. When the primary electron beam is applied to the sample surface while the sample is being etched with an ion beam, the primary electron beam is transmitted by the sample when the sample becomes sufficiently thin, so that the primary electron beam reaches the Faraday cup disposed on the rear surface of the sample. This enables the etching to be stopped when the sample has an appropriate thickness. However, the idea is not shown of performing a surface analysis of a microscopic area of the sample.

SUMMARY OF THE INVENTION

An object of the invention is to provide an apparatus and method for analyzing a microscopic area, capable of controlling the scattering and the reflection of the primary electron beam, micrifying the Auger electron generation area and removing the influence of the scattering and the reflection of the primary electron beam transmitted by the sample.

The invention provides a microscopic area analyzing apparatus for applying a primary electron beam to a sample and for analyzing a secondary electron generated from the sample, the analyzing apparatus comprising:

a sample support capable of mounting the sample on a surface thereof; and capturing means for capturing a primary electron beam transmitted by the sample.

According to the Invention, when the primary electron beam is applied to the sample mounted on the sample support, the primary electron beam transmitted by the sample is captured by the capturing means so that the electron beam exerts no influence on the analysis of the sample. By thinning the sample, controlling the scattering and the reflection of the primary electron beam and micrifying the Auger electron generation area, the influence is removed of the scattering and the reflection of the primary electron beam transmitted by the sample.

The invention is characterized in that as the capturing means is provided with at least one Faraday cup for capturing the primary electron beam transmitted by the sample and at least one hole through which the primary electron beam transmitted by the sample passes from the surface of the sample support to the Faraday cup in the sample support.

According to the invention, since at least one Faraday cup and at least one hole are provided in the sample support, the primary electron beam transmitted by sample passes through the hole, is directed from the surface of the sample support to the Faraday cup and is captured and absorbed within the Faraday cup.

The invention is characterized in that potential voltage of the Faraday cup is kept to a predetermined potential.

According to the invention, since the potential of the Faraday cup is the grounded potential, the analysis is performed with stability.

The invention is characterized in that the Faraday cup is electrically insulated from an outside of the sample support.

According to the invention, since the Faraday cup is electrically insulated from the outside of the sample support, the Faraday cup is easily maintained at an arbitrary potential including the ground potential.

The invention is characterized in that a diameter of the hole is not less than a diameter of the primary electron beam but not more than 200 micrometers.

According to the invention, since the diameter of the hole formed from the sample support surface to the Faraday cup is not less than the diameter of the primary electron beam, the primary electron beam transmitted by the sample is sufficiently directed to the Faraday cup. Since the diameter of the hole is not more than 200 micrometers, the primary electron beam directed into the Faraday cup is captured in the Faraday cup and the probability is reduced that the primary electron beam exits therefrom.

Further, the invention provides a microscopic area analyzing apparatus comprising:

means for applying a primary electron beam to a sample to be analyzed, in order to electrically excite the sample to be analyzed;

deflection means for deflecting and scanning the primary electron beam;

electron beam analyzing means for analyzing a secondary electron generated from the sample;

sensing means for sensing the electron analyzed by the electron beam analyzing means; and a sample support for mounting the sample thereon, wherein at least one Faraday cup for capturing the primary electron beam transmitted by the sample and at least one hole through which the primary electron beam transmitted by the sample passes from a surface of the sample support to the Faraday cup are provided in the sample support.

According to the invention, at least one Faraday cup for capturing the primary electron beam transmitted by the sample is provided in the sample support for mounting the sample thereon. Since at least one hole is provided through which the primary electron beam transmitted by the sample passes from the surface of the sample support to the Faraday cup, the expansion of the analysis area due to the scattering of the primary electron beam is restrained, so that the surface analysis of the microscopic area is performed with high precision. Since the secondary electron generation area is micrified in the solid sample used for SEM (scanning electron microscope) observation, the resolution of the SEM observation improves.

The invention is characterized in that potential voltage of the Faraday cup is kept to a predetermined potential.

According to the invention, by grounding the potential of the Faraday cup, the variation in potential of the Faraday cup is restrained, so that stable data are obtained.

Further, the invention provides a microscopic area analyzing method for applying a primary electron beam to a microscopic area of a sample and analyzing a secondary electron generated from the sample, the method comprising the steps of:

thinning at least a part of the sample so that the sample can transmit the primary electron beam; and analyzing the secondary electron from a surface of the sample while the primary electron beam transmitted by the sample is captured and absorbed.

According to the invention, when the primary electron beam is applied to the sample at least partly thinned, the primary electron beam transmitted by the sample is captured and absorbed, so that the primary electron beam exerts no influence on the analysis of the sample. The scattering and the reflection of the primary electron beam can be controlled by at least partly thinning the sample.

The invention is characterized in that the capture of the primary electron beam transmitted by the sample is performed by the Faraday cup formed in the sample support for mounting the sample thereon.

According to the invention, the Faraday cup is formed in the sample support, so that the primary electron beam transmitted by the sample is captured and absorbed.

The invention is characterized in that the Faraday cup is maintained at a ground potential.

According to the invention, since the potential of the Faraday cup is maintained at the ground potential, the analysis is performed with stability.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
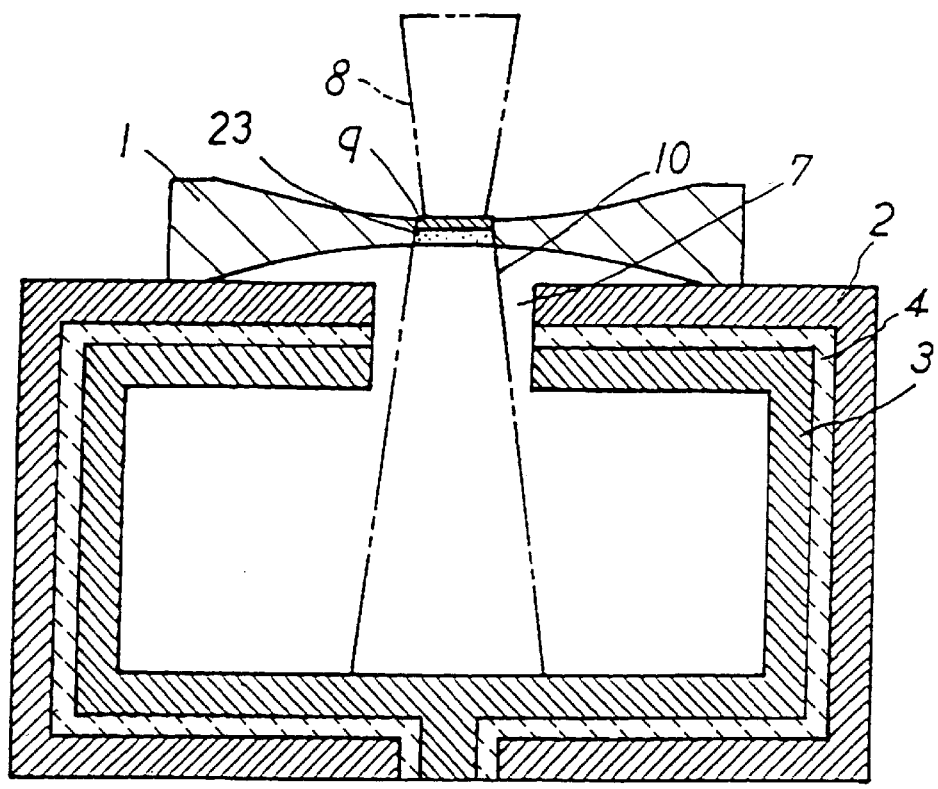
FIG. 1 is a schematic cross-sectional view showing a primary electron beam application area in analyzing a thinned sample 1 in an AES apparatus according to an embodiment of the invention.

Now referring to the drawings, preferred embodiments of the invention are described below.

Figure 2:
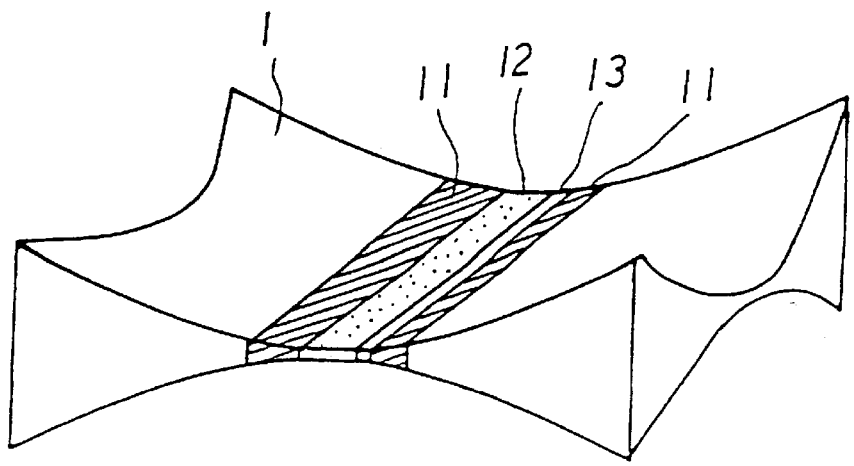
FIG. 2 is a perspective view showing the thinned sample 1 used in the embodiment of FIG. 1.
Figure 3:
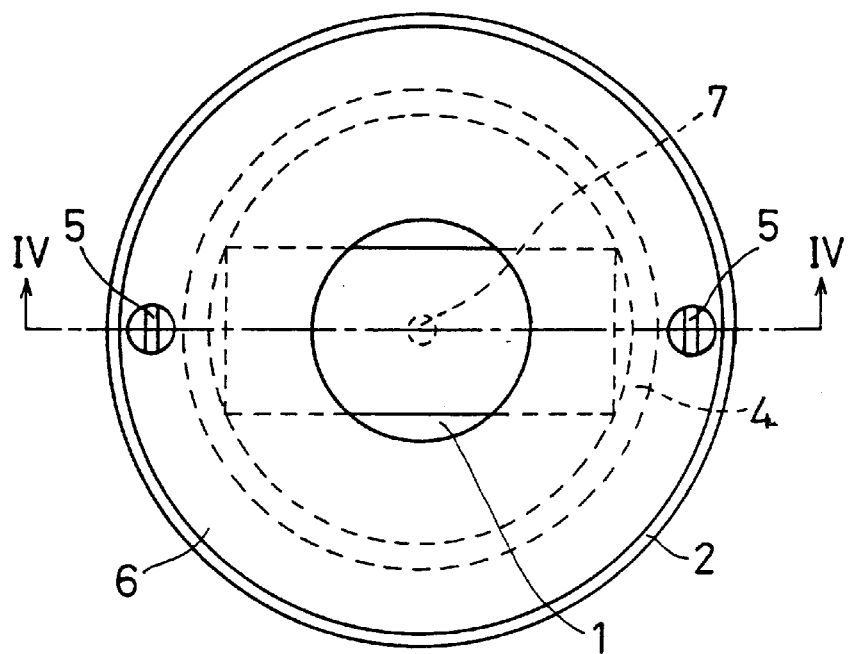
FIG. 3 is a plan view showing a condition where the sample 1 is fixed to a sample support 2 in the embodiment of FIG. 1.
Figure 4:
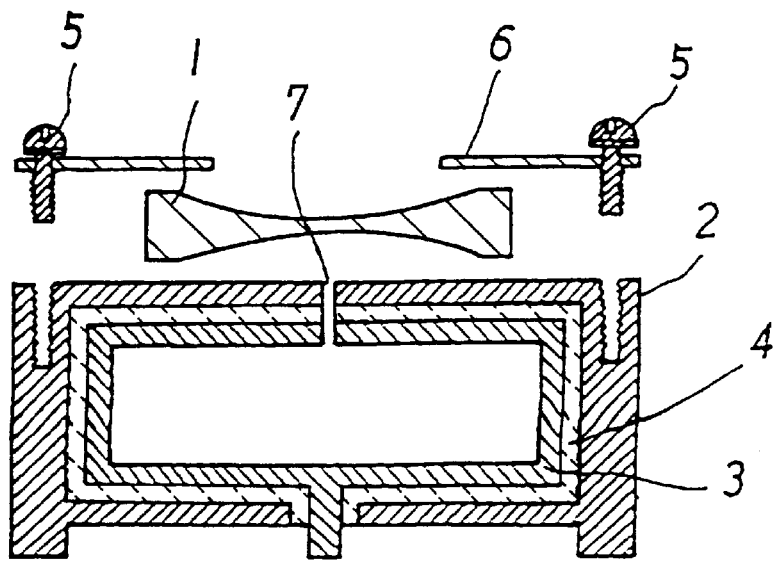
FIG. 4 is a cross-sectional view taken on the line IV—IV of FIG. 3.
Figure 5:
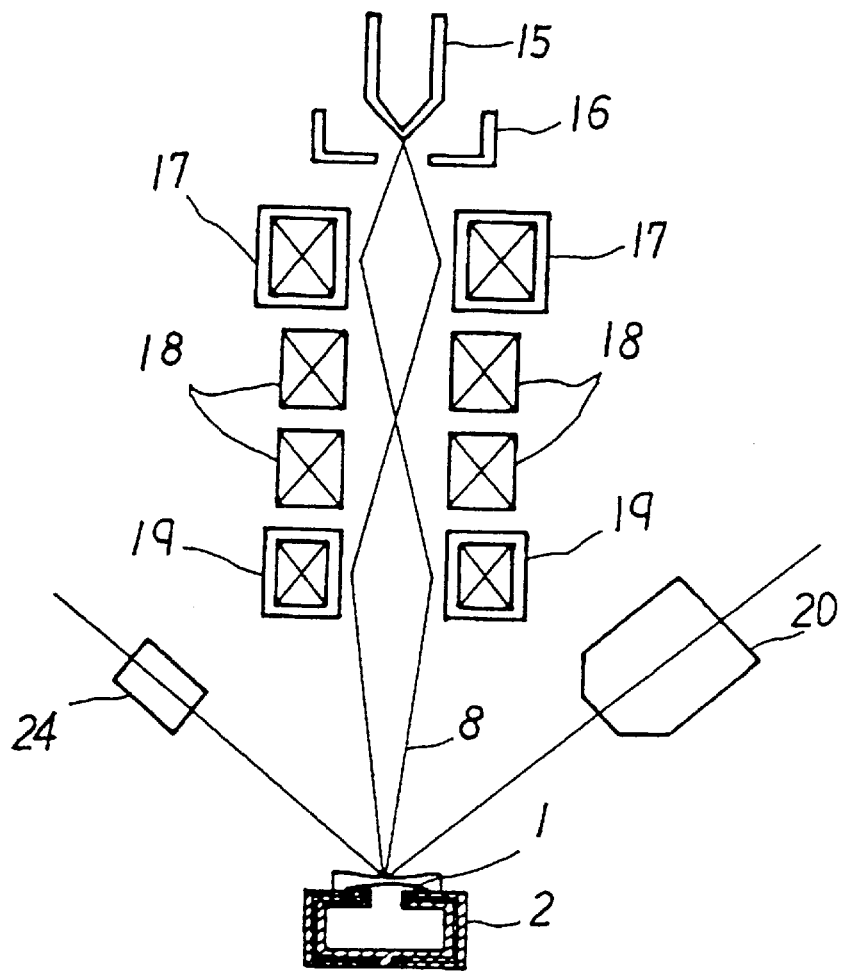
FIG. 5 is a view showing a basic structure of an AES apparatus used in the embodiment of FIG. 1.
Figure 6:
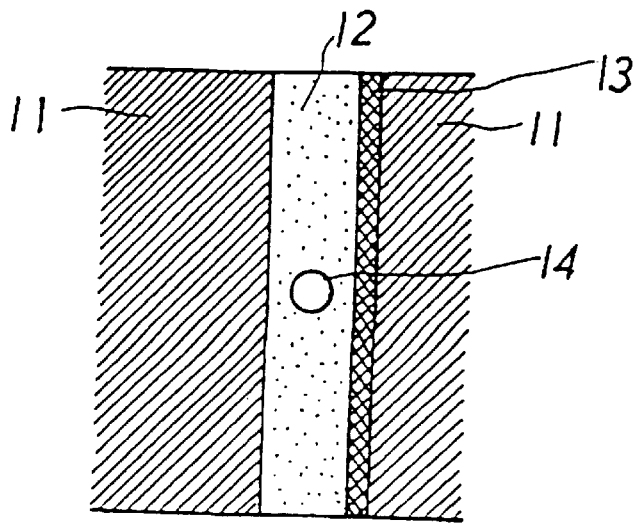
FIG. 6 is an enlarged partial plan view showing a vicinity of the primary electron beam application area of the thinned sample 1 of FIG. 2 in the embodiment of FIG. 1.
Figure 7:
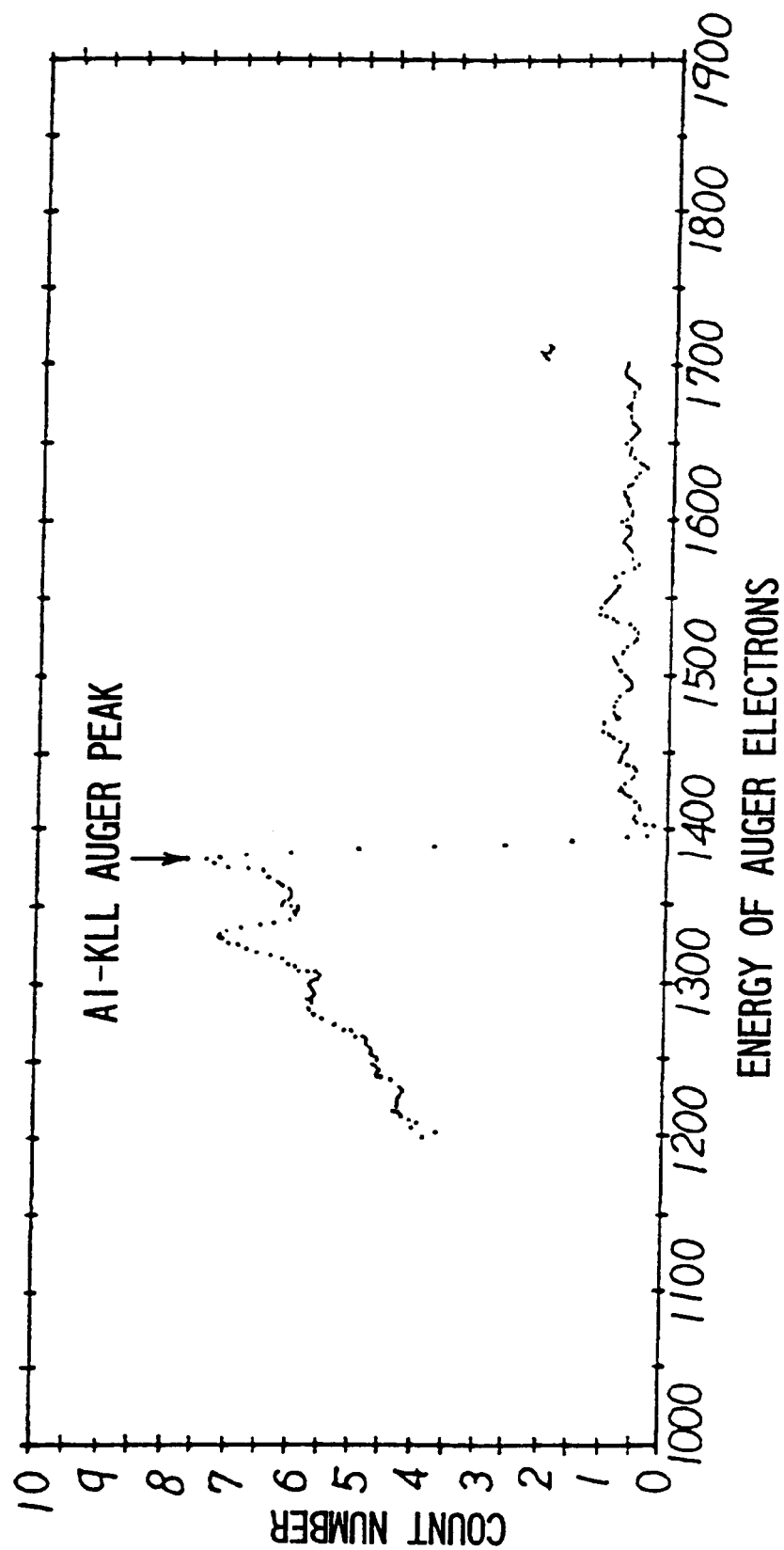
FIG. 7 is a view showing a result of an AES analysis for the primary electron beam application area of FIG. 6.

FIG. 1 schematically shows a primary electron beam application area in analyzing a thinned sample. FIG. 2 shows an appearance of the thinned sample. FIG. 3 shows a condition where the sample is fixed to a sample support. FIG. 4 shows a cross section taken on the line IV—IV of FIG. 3. FIG. 5 shows a basic structure of an AES apparatus. FIG. 6 is an enlarged view of a vicinity of the primary electron beam application area of the thinned sample of FIG. 2. FIG. 7 shows a result of an AES analysis for the primary electron beam application area of FIG. 6.

As shown in FIG. 1, a sample support 2 on which the thinned sample 1 is mounted has a Faraday cup 3 therein. The Faraday cup 3 is electrically insulated by an insulator 4 with respect to the outer surface side of the sample support 2. The thinned sample 1 is fixed to the sample support 2 with the sample fixing screws 5 and the sample fixing plate 6. The sample support 2 has a small-diameter hole 7 in a portion where the thinned sample 1 is fixed, so that the applied primary electron beam 8 is directed to the Faraday cup 3 after transmitted by the thinned sample 1. When the primary electron beam 8 is applied to the thinned sample 1, Auger electrons generated from an Auger electron generation area 9 are observed, and a primary electron beam 10 transmitted by the thinned sample 1 passes through the hole 7 and is absorbed within the Faraday cup 3.

In this embodiment, in order to precisely align the point of analysis with the hole 7 reaching the Faraday cup 3 and to reduce the path of the primary electron beam 10 transmitted by the thinned sample 1, the Faraday cup 3 is disposed in the sample support 2 with the insulator 4 between. The sample support 2 is made of a material similar to that of the conventionally used sample support 22. As the insulator 4, a ceramic-made insulator is used. Since the Faraday cup 3 is electrically insulated from the outside of the sample support 2 by the insulator 4, the Faraday cup 3 is maintained at an arbitrary potential including the ground potential.

Since the electron beam 10 entering through the very small hole 7 of the Faraday cup 3 is scattered and reflected within the Faraday cup 3 so that the probability is very low that the electron beam 10 exits from the Faraday cup 3, the Faraday cup 3 is widely used for measuring the amount of current of the primary electron beam in the surface analysis. According to the invention, by using the characteristic of the Faraday cup 3, the phenomenon is precluded that the primary electron beam 10 again affects the sample 1, and the sample is easily fixed onto the Faraday cup 3.

It is desirable that the hole 7 formed from the Faraday cup 3 to reach the sample support 2 be as small as possible. In order to decrease the probability that the primary electron beam 10 transmitted by the thinned sample 1 exits from the Faraday cup 3, it is desirable that the diameter of the hole 7 be not less than the diameter of the primary electron beam 8 but not more than 200 micrometers. While in this embodiment, one Faraday cup 3 is incorporated and the sample support 2 having the hole 7 formed from one Faraday cup 3 to reach the outer surface is used as an example, the number and configuration of the Faraday cup 3 in the sample support 2 and the number and configuration of the hole 7 may be changed according to the number of samples under measurement.

As shown in FIG. 2, the sample 1 is thinned so that the portion is thinner where the silicon oxide film 11, the aluminum film 12, the titanium-tungsten film 13 and the silicon oxide film 11 are present. As shown in FIGS. 3 and 4, to fix the thinned sample 1 to the sample support 2, the sample fixing screws 5 and the sample fixing plate 6 are used. When the AES measurement is performed, as shown in FIG. 1, the primary electron beam 8 applied to the thinned sample 1 excites the Auger electrons on the surface of the thinned sample 1 and most of the primary electron beam 8 becomes the electron beam 10 transmitted by the thinned sample 1. The electron beam 10 transmitted by the thinned sample 1 passes through the hole 7 and is directed to the Faraday cup 3 disposed immediately below the sample 1. The electron beam 10 entering the Faraday cup 3 through the very small hole 7 is scattered and reflected within the Faraday cup 3, so that the probability is very low that the electron beam 10 exits from the Faraday cup 3. According to the invention, by using the characteristic of the Faraday cup 3, the primary electron beam 10 transmitted by the thinned sample 1 is effectively absorbed so that the phenomenon is precluded that the electron beam 10 again affects the thinned sample 1, and it is enabled to easily fix the sample onto the Faraday cup 3. In addition, by maintaining the Faraday cup 3 at the ground potential during the analysis, the potential of the Faraday cup 3 is stabilized, so that stable data are obtained.

Figure 11:
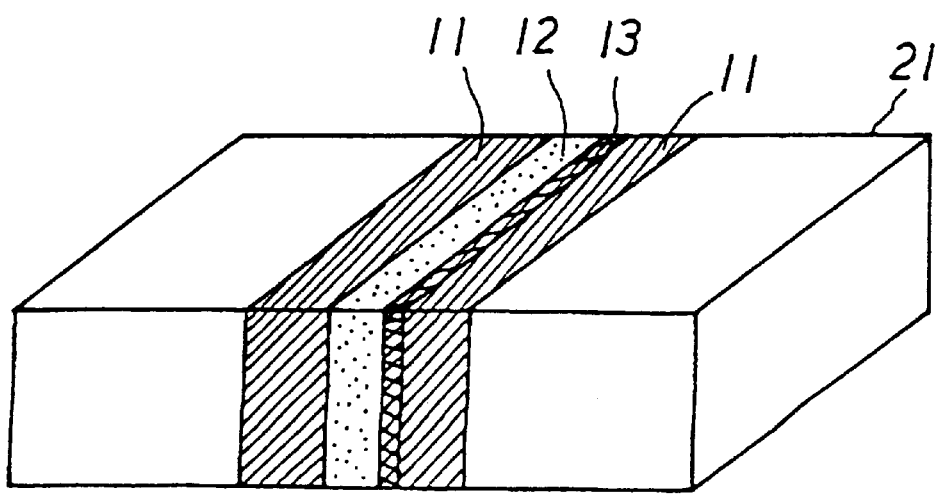
FIG. 11 is a view showing the solid sample used in the conventional method.

The procedure of the AES measurement according to the invention will hereinafter be described. First, a thick solid sample 21 as shown in FIG. 11 is thinned from both the obverse and reverse sides by machine grinding and ion beam sputtering. The portion to be analyzed is thinned to a thickness which sufficiently transmits the electron beam, so that the thinned sample 1 as shown in FIG. 2 is formed. It is desirable that the thickness of the thinner portion be not more than approximately 1000 angstroms. The thinned sample 1 formed by such a procedure is fixed to the sample support 2 having the Faraday cup 3 therein. At this time, the position of analysis of the thinned sample 1 is aligned with the hole 7 formed from the Faraday cup 3 to reach the outer surface of the sample support 2. The alignment of the hole 7 and the position of analysis is easily made by observing with an optical microscope, etc. the position of analysis in the thinned sample 1 and the hole 7 faintly viewed through the thinned sample 1. After the alignment, the sample support 2 and the thinned sample 1 are set in an AES measurement chamber maintained in an ultrahigh vacuum and the AES analysis is performed.

Figure 8:
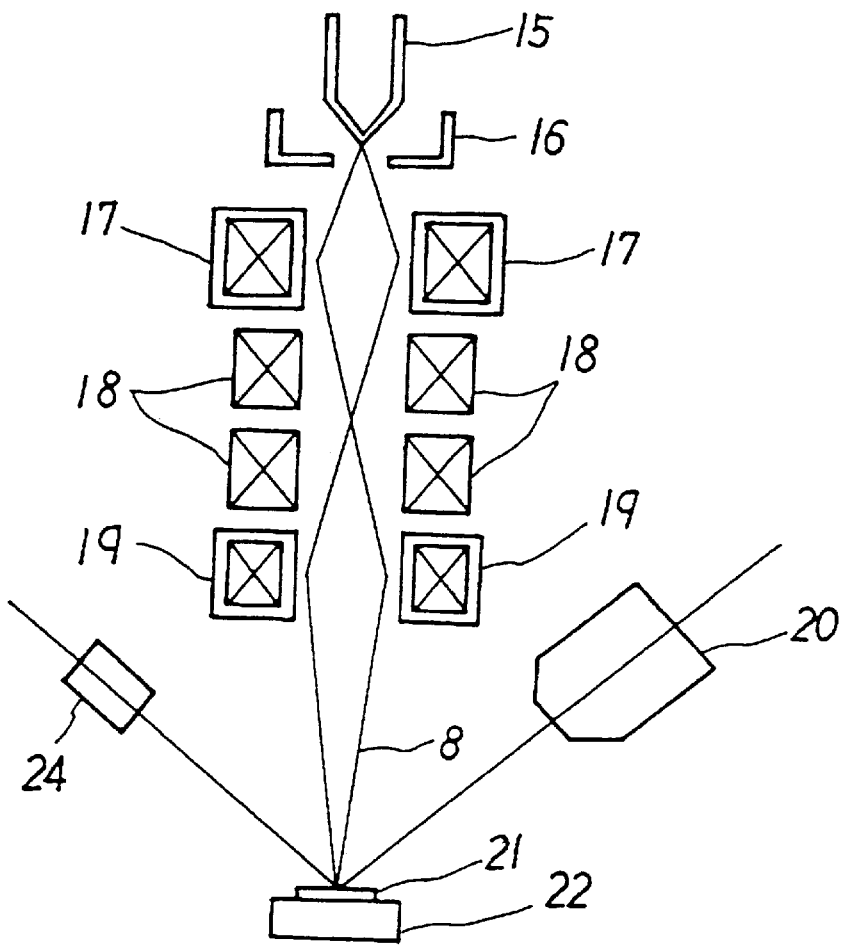
FIG. 8 is a view showing a basic structure of an AES apparatus according to a conventional method.
Figure 9:
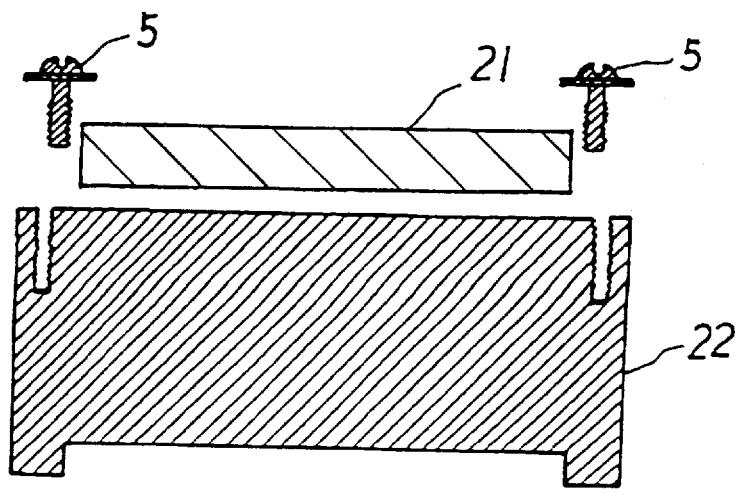
FIG. 9 is a cross-sectional view of a sample and a sample support used in the conventional method.
Figure 10:
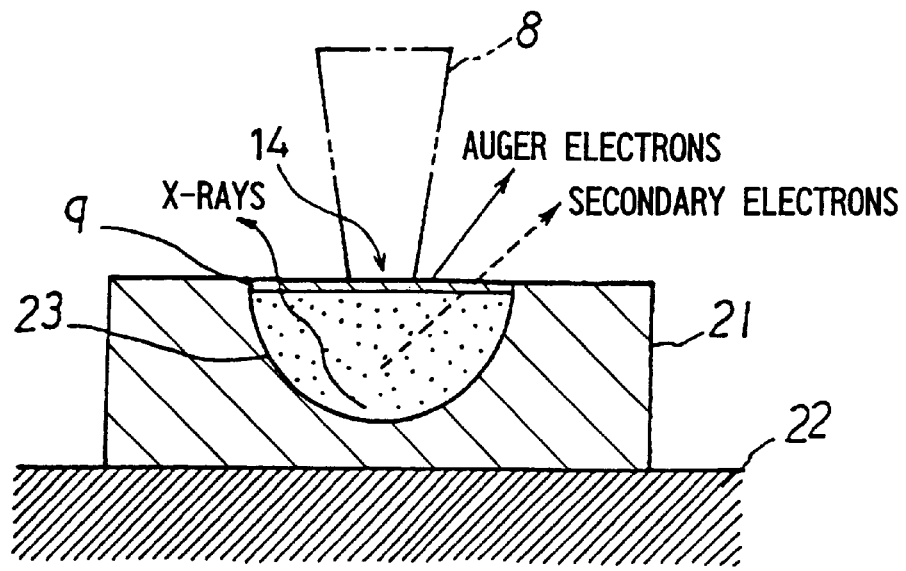
FIG. 10 is a schematic view of a primary electron application area in an analysis of the solid sample according to the conventional method.

The basic structure of the AES apparatus of this embodiment is similar to that shown in FIG. 8 except the thinned sample 1 and the sample support 2. Specifically, the electron gun comprises the filament 15 for emitting the primary electron beam 8 and the lead wire 16. The focusing lens 17 focuses the primary electron beam 8. The deflecting electrodes 18 deflect the primary electron beam 8. The objective lens 19 micrifies the primary electron beam 8. The detector 20 performs the energy analysis of the Auger electrons. The secondary electron detector 24 is provided for image observation.

The thinned sample 1 shown in FIG. 2 was formed from the solid sample 21 shown in FIG. 11 by the method described above and the AES measurement was performed with respect to the aluminum film 12 of the thinned sample 1. For the AES measurement, a 1-nanoampere primary electron beam accelerated to 20 kiloelectron volts was used. As shown in FIG. 6, the primary electron beam at this time is applied only to an area where the thickness of the aluminum film 12 is 6000 angstroms since the beam diameter, i.e. the diameter of the primary electron beam application area 14 is not more than 3000 angstroms. While the energy and the current amount of the primary electron beam are arbitrarily selected within a range from several hundreds of electron volts to several tens of kiloelectron volts and from several nanoamperes to several microamperes according to the object under measurement, in this embodiment, in order to micrify the beam diameter, the energy and the current amount are adjusted so that the acceleration is high and the current is low.

In the AES analysis using the invention, as shown in FIG. 1, the primary electron beam 8 applied to the thinned sample 1 excites the Auger electrons on the surface of the thinned sample 1 and most of the primary electron beam 8 is transmitted by the thinned sample 1 and directed to the Faraday cup 3 disposed immediately below the sample 1. The Faraday cup 3 has a characteristic that the electron beam 10 entering through the very small hole 7 is scattered and reflected within the Faraday cup 3 so that the probability is very low that the electron beam 10 exits from the Faraday cup 3. Because of this characteristic, the primary electron beam 10 transmitted by the thinned sample 1 is effectively absorbed. In addition, by maintaining the potential of the Faraday cup 3 at the ground potential during the analysis, the potential of the Faraday cup 3 is stabilized, so that stable data are obtained.

Figure 12:
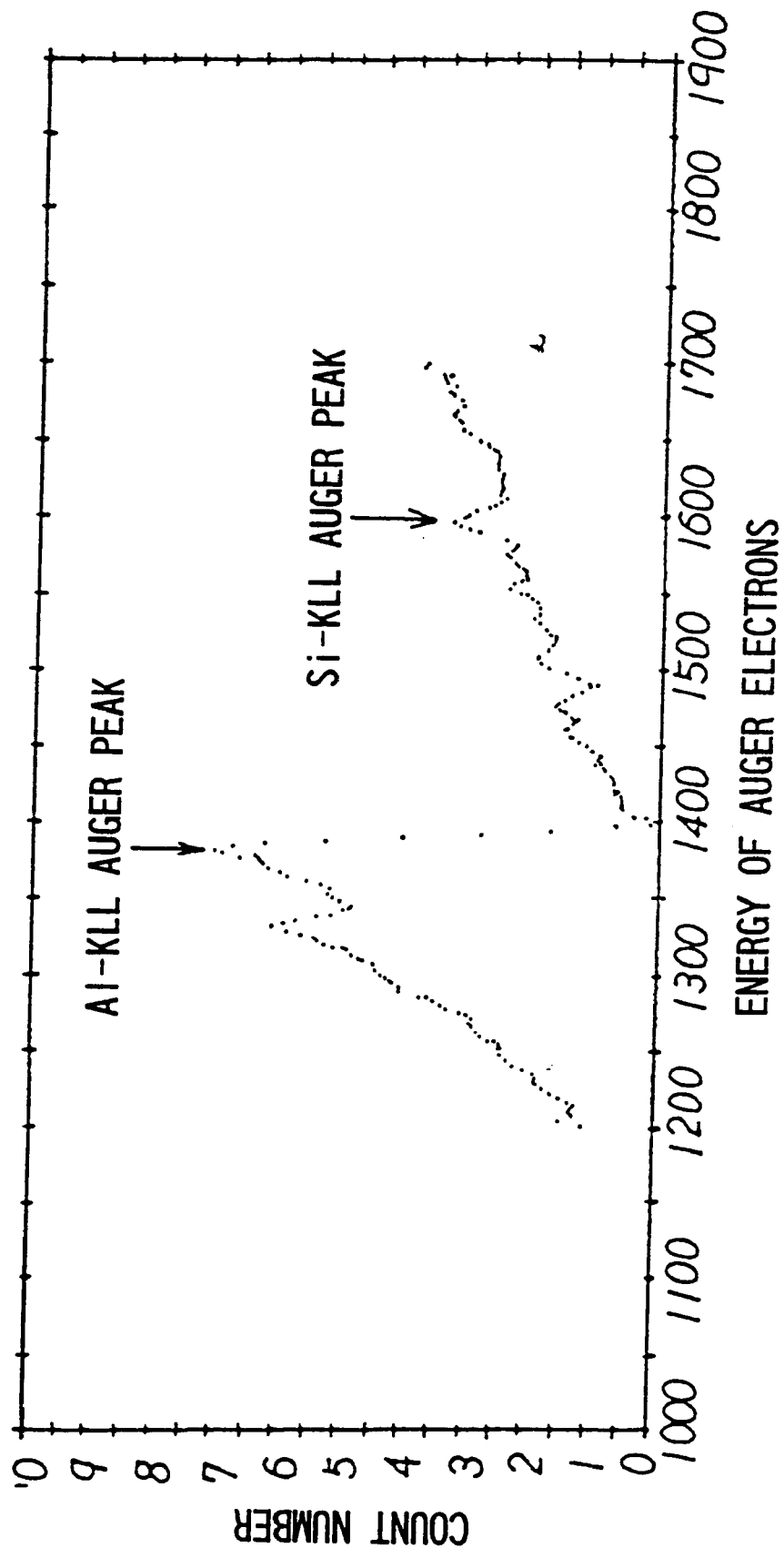
FIG. 12 is a view showing a result of an AES analysis used in the conventional method.
Figure 13:
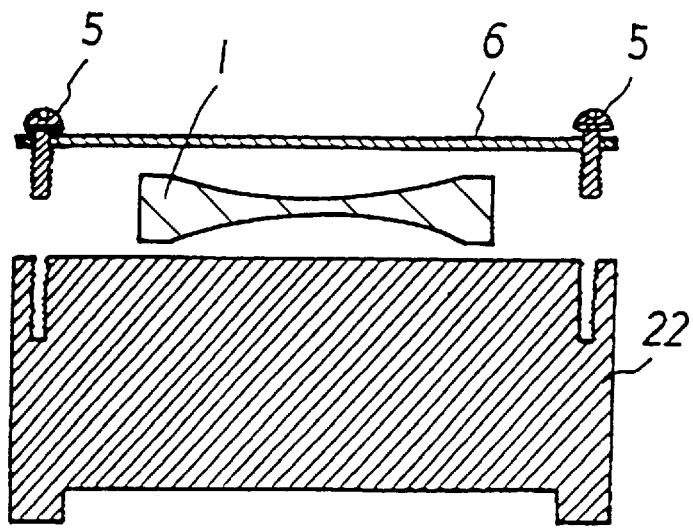
FIG. 13 is a cross-sectional view showing a condition where a thinned sample is fixed to the sample support in the conventional method.
Figure 14:
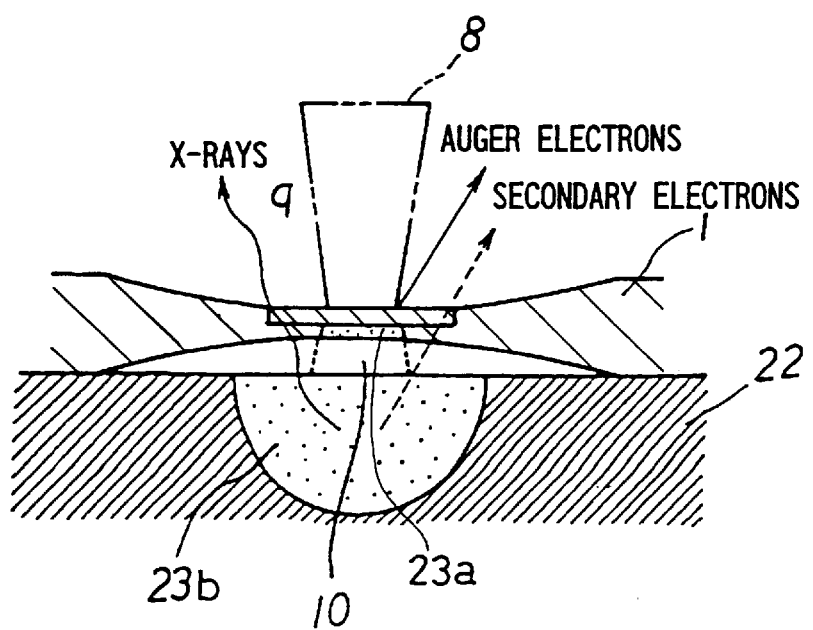
FIG. 14 is a schematic view of a primary electron beam application area in the case where the thinned sample is fixed to the sample support used in the conventional method.

Specifically, as shown in FIG. 7, in the result of the AES analysis using the invention, compared with the result of the analysis according to the conventional method shown in FIG. 12, only the Al peak is detected irrespective of the scattering of the primary electron beam.

While the sample 1 thinned from both the obverse and reverse sides is used in the embodiment described above, a sample may be used which is thinned from one of the obverse and reverse sides according to the position of analysis. In the invention, the method of thinning the sample is not limited.

The prior art of Japanese Unexamined Patent Publication JP-A 51-7993 (1976) also has the arrangement that the Faraday cup is incorporated in the sample support. However, this arrangement is provided for precisely measuring the sample current and the method of the electron application in the Auger analysis is similar to the conventional method. There is no description as to the micrifying of the area of analysis in the Auger analysis. The prior art of Japanese Unexamined Patent Publication JP-A 51-45585 (1976) relates to a microscopic area analyzing apparatus using a thinned sample like the invention. However, the prior art is different from the invention in (a) that the structure around the sample support is totally different, (b) that no consideration is given to the scattering and the reflection of the primary electron beam transmitted by the sample and (c) that the primary electron beam transmitted by the sample is not removed. Although similar in effects, the prior art and the invention are completely different in the analyzing apparatus and the analyzing method. The prior art of Japanese Unexamined Patent Publication JP-A 6-273297 (1994) uses a convergent electron beam and a Faraday cup for detecting the endpoint in ion etching. According to this art, it is impossible to perform the surface analysis of the microscopic area to which the invention is directed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A microscopic area analyzing method, the method comprising the steps of:

thinning at least a part of the sample so that the sample can transmit a portion of the primary electron beam;

irradiating the sample using the primary electron beam;

capturing and absorbing the portion of the primary electron beam transmitted by the sample;

analyzing a secondary electron beam from a surface of the sample, wherein the capturing and absorbing of the portion of the primary electron beam transmitted by the sample is performed by a Faraday cup formed in a sample support for mounting the sample thereon.

2. The microscopic area analyzing method of claim 1, wherein the Faraday cup is maintained at a ground potential.

3. A sample analyzing apparatus comprising:

a sample support for mounting a thin sample to be analyzed;

an electron beam irradiation system for irradiating at least a portion of the thin sample with a primary electron beam;

an electron absorbing element positioned to absorb that portion of the primary electron beam which passes through the irradiated portion of the thin sample; and a detector for detecting electrons generated when the primary electron beam irradiates the thin sample, wherein the electron absorbing element comprises a Faraday cup, and wherein an opening of the Faraday cup is aligned with an opening in said sample support so that the portion of the primary electron beam transmitted by the sample passes through the opening in the sample support and into the opening of the Faraday cup.

4. The sample analyzing apparatus of claim 3, wherein the electron beam irradiation system comprises:

an electron gun for emitting the primary electron beam;

a focusing lens for focusing the primary electron beam emitted by the electron gun;

deflecting electrodes for deflecting the focused primary electron beam; and an objective lens for refocusing the deflected primary electron beam.

5. The sample analyzing apparatus of claim 3, wherein the electron absorbing element is maintained at a predetermined potential.

6. The sample analyzing apparatus of claim 3, wherein the detector is configured to detect energies of the electrons generated when the primary electron beam irradiates the sample.

* * * * *